United States Patent
Lee et al.

(10) Patent No.: US 7,012,009 B2
(45) Date of Patent: Mar. 14, 2006

(54) METHOD FOR IMPROVING THE ELECTRICAL CONTINUITY FOR A SILICON-GERMANIUM FILM ACROSS A SILICON/OXIDE/POLYSILICON SURFACE USING A NOVEL TWO-TEMPERATURE PROCESS

(75) Inventors: Kuen-Chyr Lee, Hsin-Chu (TW); Liang-Gi Yao, Hsin-Chu (TW); Tien-Chih Chang, Taipei (TW); Chia-Lin Chen, Hsinchu (TW); Shih-Chang Chen, Hsin-Chu (TW); Mong-Song Liang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/785,524

(22) Filed: Feb. 24, 2004

(65) Prior Publication Data

US 2005/0186750 A1    Aug. 25, 2005

(51) Int. Cl.
*H01L 21/331*    (2006.01)
(52) U.S. Cl. .................. 438/312; 438/318; 438/478
(58) Field of Classification Search ............. 438/312, 438/318, 350, 478, 479
See application file for complete search history.

(56) References Cited

U.S. PATENT DOCUMENTS

| | | | |
|---|---|---|---|
| 5,256,550 A | | 10/1993 | Laderman et al. .......... 437/106 |
| 5,315,151 A | * | 5/1994 | Hsieh et al. ................ 257/592 |
| 5,523,243 A | | 6/1996 | Mohammad ................ 437/31 |
| 5,846,867 A | * | 12/1998 | Gomi et al. ................ 438/318 |
| 5,951,757 A | | 9/1999 | Dubbelday et al. ......... 117/102 |
| 6,251,738 B1 | | 6/2001 | Huang ....................... 438/312 |
| 6,346,453 B1 | | 2/2002 | Kovacic et al. ............ 438/312 |
| 2004/0157399 A1 | * | 8/2004 | Lee et al. ................... 438/364 |
| 2004/0192002 A1 | * | 9/2004 | Soman et al. .............. 438/312 |

* cited by examiner

*Primary Examiner*—Trung Dang
(74) *Attorney, Agent, or Firm*—Haynes and Boone, LLP

(57) ABSTRACT

A method for making an improved silicon-germanium layer on a substrate for the base of a heterojunction bipolar transistor is achieved using a two-temperature process. The method involves growing a seed layer at a higher temperature to reduce the grain size with shorter reaction times, and then growing an epitaxial Si—Ge layer with a Si cap layer at a lower temperature to form the intrinsic base with low boron out-diffusion. This results in an HBT having the desired narrow base profile while minimizing the discontinuities (voids) in the Si—Ge layer over the insulator to provide good electrical contacts and uniformity to the intrinsic base.

23 Claims, 3 Drawing Sheets

METHOD FOR IMPROVING THE ELECTRICAL CONTINUITY FOR A SILICON-GERMANIUM FILM ACROSS A SILICON/OXIDE/POLYSILICON SURFACE USING A NOVEL TWO-TEMPERATURE PROCESS

BACKGROUND OF THE INVENTION (1) Field of the Invention

The present invention relates to a method for making a semiconductor substrate having a Silicon-Germanium (Si—Ge) layer for improved semiconductor device performance. More particularly the method utilizes a high-temperature process step to deposit a seed layer to minimize the discontinuities in the seed layer. The Si—Ge layer grown on the seed layer results in improved electrical continuity. The Si—Ge layer can be grown at a lower temperature to minimize the change in the dopant profile while retaining the improved electrical continuity. This two-temperature process is particularly useful for forming Si—Ge bases on heterojunction bipolar transistors (HBT) with minimal change in dopant profile when the Si—Ge bases must extend over an oxide isolation when providing the base contact for the Si—Ge base.

(2) Description of the Prior Art

In the past few years the Si—Ge heterojunction bipolar transistor has received much attention because of improved device performance over the conventional NPN transistor. As the size of the bipolar transistor is reduced, the high frequency performance (maximum cut-off frequency) is limited by the ability to further reduce the base width and to improve the emitter injection efficiency. Also, as the base dopant is further increased in concentration, the parasitic capacitance and the like limit the upper frequency range. One method of overcoming this high frequency limitation is to make an HBT having a Si—Ge base to modify the bandwidths in the base to improve the emitter injection efficiency and to improve electron mobility.

Several methods of fabricating heterojunction bipolar transistors have been reported in the literature. For example, U.S. Pat. No. 6,346,453 B1 to Kovacic et al. describes a method for making an HBT using a sacrificial layer over a Si—Ge layer to protect an area for where an emitter is later formed. U.S. Pat. No. 5,523,243 to Mohammad describes a method for making a triple HBT by forming a Si/Si—Ge superlattice for the base and a second superlattice for the emitter. A rectangular groove is etched through the emitter to make the extrinsic base contact. U.S. Pat. No. 5,256,550 to Laderman et al. describes a method for forming a strained $Si_xGe_{1-x}$ layer for the base of a bipolar transistor to improve the emitter injection efficiency. Huang in U.S. Pat. No. 6,251,738 B1 describes a method for making a Si—Ge base on a mesa and then removing the Si—Ge adjacent to the mesa. In a second embodiment a mesa is formed surrounded by a trench that is filled with a dielectric layer, and a selective epitaxial Si—Ge is grown on the mesa top surface to form the Si—Ge base.

One of the problems associated with making an HBT is not being able to form a good quality boron-doped Si—Ge layer for the intrinsic base, while providing a continuous Si—Ge layer over a non-crystalline surface, such as $SiO_2$ for making electrical contact to the extrinsic base area.

To better understand this problem, FIGS. 1 and 2 depict the sequence of steps for growing a Si—Ge layer by the current typical process. FIG. 1 shows a schematic cross-sectional view of a partially completed NPN hetero-junction bipolar transistor (HBT) on a silicon substrate 10. The Fig. shows an $N^-$ subcollector 14 formed in the substrate 10. Shallow trench isolation (STI) regions 12 are formed in the substrate over the subcollector 14. The STI regions surround the device areas 2. An insulating layer 16 and a polysilicon layer 18 are deposited, and openings 4 are formed in layers 16 and 18 over the device areas 2 and extend over the STI regions 12. To make this HBT, a relatively thin seed layer 20 is grown on the device areas 2 and is also formed over the STI regions 12 and over the polysilicon layer 18. The seed layer 20 over the non-crystalline STI 12 has relatively large grain sizes that result in discontinuities (voids), as indicated by G in FIG. 1. As shown in FIG. 2, for a boron-doped base in an HBT, an in-situ boron-doped Si—Ge layer 22 is epitaxially grown on the seed layer 20 over the device areas 2, and because of the large grain size (discontinuities) in the seed layer over the STI 12, the Si—Ge also has discontinuities. This results in poor electrical conductivity and uniformity between the intrinsic base 2 and the base contact, which is formed in the region C over the patterned polysilicon layer 18 outside the STI region. To avoid excessive out-diffusion of boron from the Si—Ge base, the seed layer 20 and the Si—Ge layer 22 are deposited at relatively low temperatures that results in the large grain sizes with longer reaction time and poor electrical properties.

There is still a need in the semiconductor industry to improve upon the current process for making a doped single-crystal Si—Ge intrinsic base with minimal out-diffusion, while providing good electrical contact between the intrinsic base and the extrinsic base contact region.

SUMMARY OF THE INVENTION

A principal object of this invention is to form a doped Si—Ge epitaxial layer on adjacent Si/oxide/polysilicon surfaces having improved electrical continuity and uniformity across the oxide surface between the Si substrate and the polysilicon layer using a two-temperature process.

A second object of the present invention is to grow an epitaxial Si seed layer across the adjacent Si/oxide/polysilicon surfaces, at an elevated first temperature, to minimize the grain structure of the Si seed layer on the oxide surface with shorter reaction time for growing an improved epitaxial Si—Ge layer thereon.

A further object of this invention is to grow the Si—Ge layer at a second, lower temperature to maintain the desired dopant profile in the Si—Ge epitaxial layer.

In summary, the present invention relates to a method for making an improved silicon-germanium base for a heterojunction bipolar transistor. A two-temperature process is used to form the Si—Ge base. The seed layer is formed at a high temperature to provide a smaller grain size over a silicon oxide surface with shorter reaction times, resulting in improved electrical continuity and uniformity. Then a lower temperature is used to deposit a Si—Ge epitaxial layer and a cap layer to maintain a narrow dopant profile for the base. Because of the improved electrical continuity and uniformity of the Si—Ge layer over the $SiO_x$, the resistance for the base contact is improved. The method is described for an NPN bipolar transistor. These objectives are achieved by providing a single-crystal silicon substrate. A bipolar-transistor subcollector is formed in the substrate by doping with phosphorus or arsenic. A shallow trench isolation region composed of $SiO_2$ is formed over the collector and surrounding a device area for the base. An insulating layer and a polysilicon layer are deposited on the substrate. An opening is etched in the polysilicon layer and in the insulating layer over the device area, and the opening extends partially over the shallow trench isolation region. A blanket seed layer is deposited on the substrate to form an epitaxial layer over the device area. A key feature of this invention is to deposit the seed layer at an elevated (first) temperature to reduce the grain size of the seed layer with shorter reaction time on the shallow trench isolation region composed of $SiO_2$. The reduced grain size results in fewer voids and discontinuities in the seed layer over the STI oxide. Another key feature is to use a lower (second) temperature to form a silicon-germanium layer in-situ doped with boron, and to form a silicon cap layer on the blanket seed layer. The reduced second temperature minimizes the boron dopant profile for the base, while the reduced grain size of the seed layer results in fewer discontinuities and improves the electrical conductivity of the Si—Ge layer over the shallow trench region. The silicon cap layer, the Si—Ge layer, the seed layer, and the polysilicon layer are patterned to form the Si—Ge base for the bipolar transistor over the device area. The base also extends over the shallow trench isolation region and over the polysilicon layer to provide an electrical contact region for the base. By reducing the grain size of the seed layer, and subsequently the Si—Ge layer, the electrical continuity between the base and the base contact is significantly improved.

BRIEF DESCRIPTION OF THE DRAWINGS

The objects and other advantages of this invention are best understood with reference to the preferred embodiment when read in conjunction with the following drawings.

DESCRIPTION OF THE PREFERRED EMBODIMENT

A novel method for making a Si—Ge base on a bipolar transistor having improved electrical continuity over the shallow trench oxide between the bipolar base and the bipolar base contact area is now described in detail. The method utilizes a sequential two-temperature deposition process, which results in smaller closely spaced grains over the STI ($SiO_2$) that improves the electrical continuity between the active base area and the base contact of the bipolar transistor. A seed layer is deposited at a high temperature to reduce grain size and to improve continuity, and an epitaxial Si—Ge layer is grown at a lower temperature on the seed layer to minimize the dopant profile in the Si—Ge layer (base). Although the method is described for an NPN bipolar transistor, it should be understood by those skilled in the art that by reversing the dopant polarities, the method can also be used to make PNP bipolar transistors.

Figure 1:
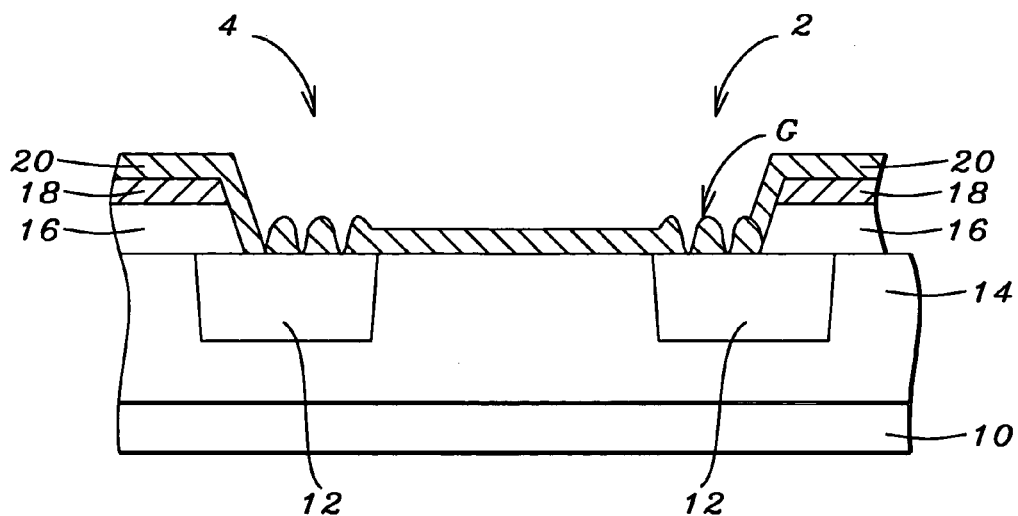
FIG. 1 shows a schematic cross-sectional view of a portion of a wafer through a partially completed bipolar transistor and depicts a seed layer for forming the base having large grain size and discontinuity over the shallow trench isolation oxide for a conventional technique.
Figure 2:
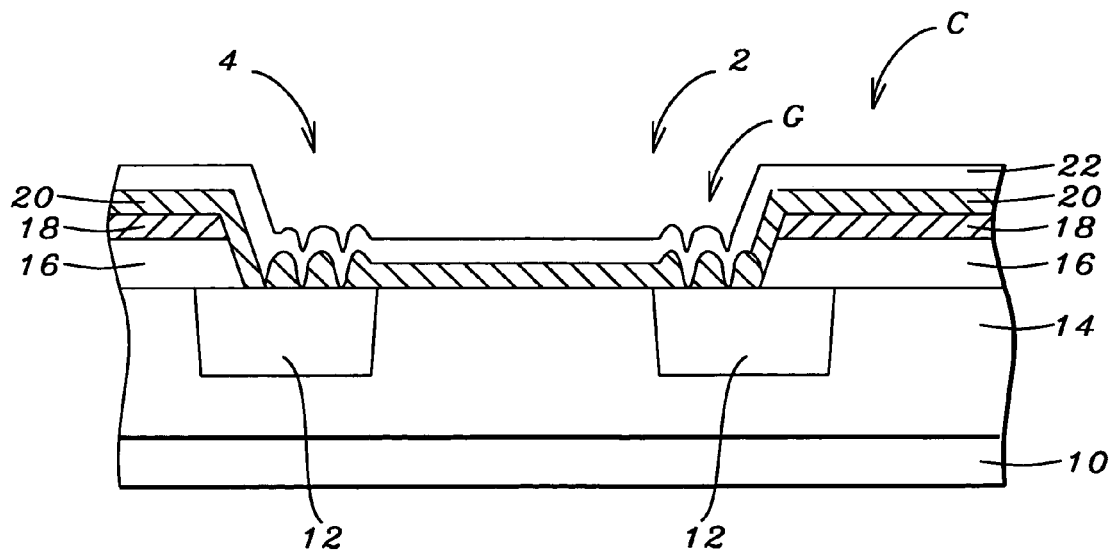
FIG. 2 shows a schematic cross-sectional view of the partially completed bipolar transistor of FIG. 1 after depositing the epitaxial Si—Ge layer for the base, and shows the discontinuity in the epi layer over the shallow trench isolation oxide for a conventional technique.
Figure 3:
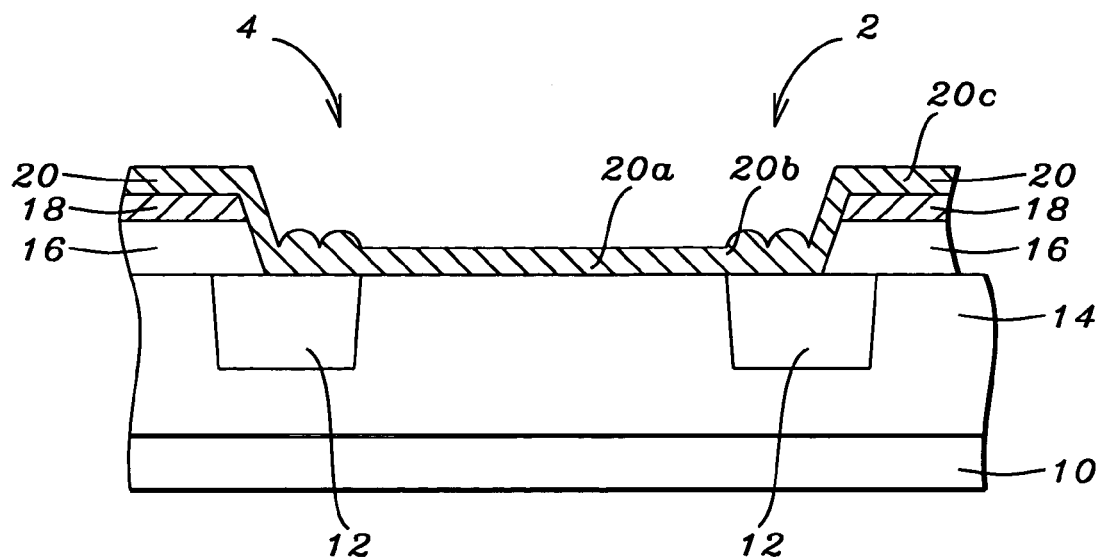
FIGS. 3–5 show schematic cross-sectional views of a portion of a wafer depicting the sequence of process steps for fabricating the base for a bipolar transistor having an improved grain structure over the shallow trench isolation oxide that results in better electrical continuity achieved by the method of this invention.

Referring to FIG. 3, the method begins by providing a silicon substrate 10. Preferably the substrate is a single-crystal silicon having a <100> crystallographic orientation, and for an NPN bipolar transistor the substrate is doped P type with boron. Next subcollectors 14 are formed in the substrate 10, one of which is shown in the Figs. The subcollectors are typically surrounded and electrically isolated by deep trench isolation (DTI), which are not shown to simplify the drawings. The subcollectors 14 are typically formed by in-situ doping with phosphorus, for example, using ion implantation, and are doped to a preferred concentration of between about 1.0 E 16 and 1.0 E 17 atoms/$cm^3$. The collectors 14 are formed to a preferred depth of between about 3000 and 8000 Angstroms. Next shallow trenches are etched, for example, using a photoresist mask and plasma etching, in the subcollector areas 14 to a preferred depth of between about 2000 and 5000 Angstroms. The trenches are then filled with a chemical-vapor deposited (CVD) silicon oxide and polished back to be planar with the substrate surface 10 to form the shallow trench isolation regions (STI) 12 over the subcollectors 14. The STI regions 12 surround and define the device areas 2 for the bipolar transistor base regions.

Still referring to FIG. 3, a blanket insulating layer 16 is deposited on the substrate. Layer 16 is preferably a $SiO_2$ deposited by low-pressure CVD (LPCVD) using, for example, a reactant gas such as tetraethosiloxane (TEOS), and is deposited to a thickness of between about 300 and 800 Angstroms, and more specifically to a thickness of about 500 Angstroms. Next, a polysilicon layer 18 is deposited on the $SiO_2$ layer 16. The polysilicon layer 18 is deposited by LPCVD using a reactant gas such as silane ($SiH_4$), and is deposited to a thickness of between about 300 and 800 Angstroms, and more specifically to a thickness of about 500 Angstroms. A photoresist mask and plasma etching are used to etch openings 4 in the polysilicon layer 18 and in the insulating layer 16 over the device areas 2 for forming the Si—Ge base. The openings 4 also extend partially over the STI regions 12.

Continuing with FIG. 3, a blanket seed layer 20 is deposited on the substrate. The seed layer 20 is preferably a doped silicon and is deposited epitaxially by CVD or by molecular beam epitaxy using, for example, a reactant gas such as $SiH_4$. The seed layer 20 is deposited to a preferred thickness of between about 100 and 300 Angstroms, and more specifically to a thickness of about 200 Angstroms. Layer 20 forms a good quality epitaxial layer 20A over the base regions 2, a smaller grain-size polysilicon 20B over the STI regions 12, and a portion 20C of the seed layer extends over the underlying polysilicon layer 18, that later serves as a contact for the base. A key feature of this invention is to deposit the seed layer 20 at an elevated (first) temperature to reduce the grain size of the seed layer 20B with a shorter reaction time on the $SiO_2$ STI regions 12, while providing a good quality epitaxial layer 20A on the single-crystal silicon substrate in the device areas 2 for the bipolar transistor bases. The blanket seed layer 20 is deposited at a preferred temperature of between about 600 and 750° C. The smaller grain size of portion 20B over the STI oxide 12 results in fewer discontinuities (voids) and improves the electrical conductivity and uniformity when a Si—Ge base is formed. The higher deposition temperature of the seed layer 20 also reduces the deposition time and improves product throughput.

Figure 4:
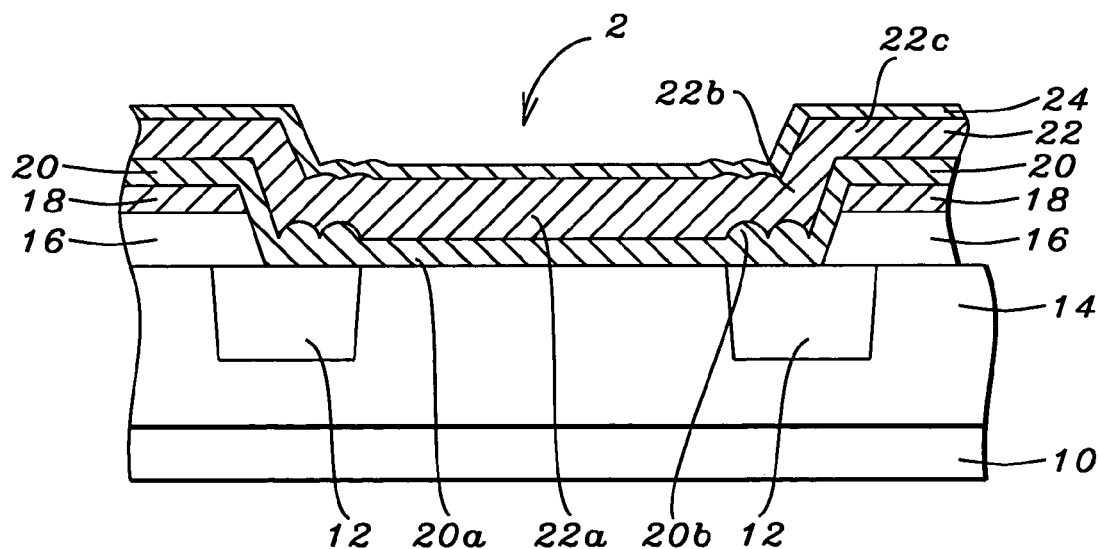

Referring to FIG. 4, and another key feature of this invention is to use a lower (second) temperature to form an epitaxial silicon-germanium layer 22. Layer 22 is in-situ doped with boron to form the base for the bipolar transistor over the device areas 2. The Si—Ge layer 22 is deposited using low-pressure vapor deposition using reactant gases consisting of $SiH_4$ and $GeH_4$. The flow rates of the reactant gases are controlled in the epitaxy system (LPCVD) to achieve an atomic percent germanium of between about 10 and 20 in the Si—Ge layer 22. A boron dopant gas, such as diborane hydride ($B_2H_6$), is added during the epitaxial deposition to dope the base with boron to a concentration of between about 1.0 E 18 and 1.0 E 20 atoms/cm$^3$. The epi Si—Ge layer 22 is deposited at a preferred temperature that is about 50° C. lower than the deposition temperature of the seed layer 20 to minimize the boron dopant profile of the base. The portion 22A of layer 22 over the device areas 2 forms a good quality Si—Ge layer for the base, while the portion 22B over the STI regions 12 has reduced grain size because of the reduced grain size of the underlying portion 20B of the seed layer 20. The reduced grain size of the Si—Ge portion 22B also results in fewer discontinuities (voids), thereby improving the electrical conductivity between the base 22A and the contact region 22C.

Stile referring to FIG. 4, a silicon cap layer 24 is epitaxially formed on the Si—Ge layer 22. The cap layer 24 is deposited at the same lower temperature as the Si—Ge layer 22 So prevent excessive boron diffusion. Layer 24 is deposited to a preferred thickness of between about 50 and 200 Angstroms, and more specifically to a thickness of about 100 Angstroms.

Figure 5:
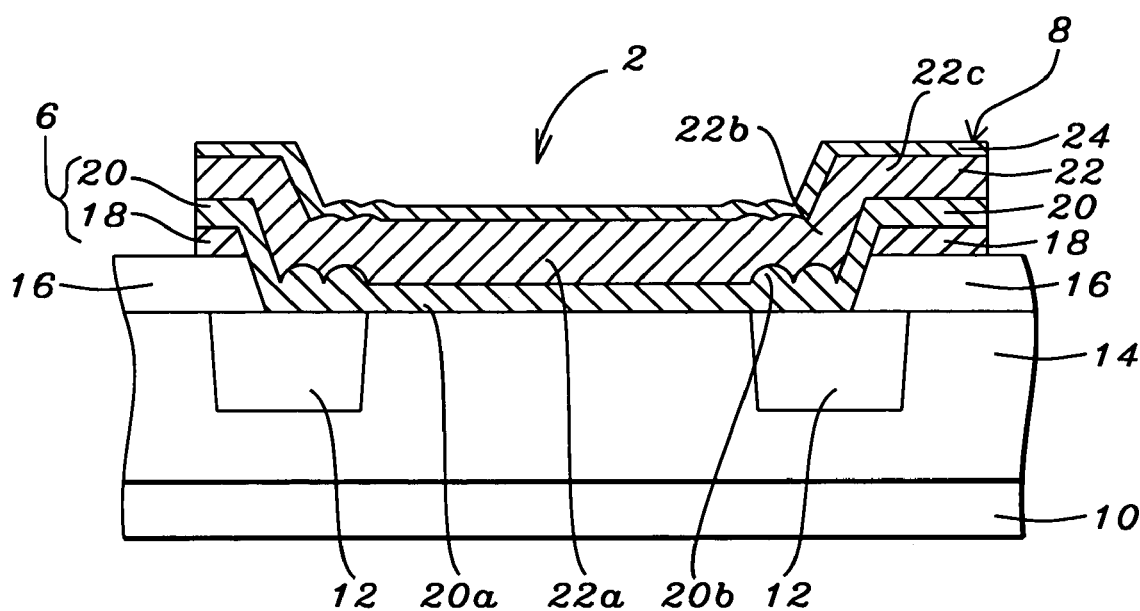

Referring to FIG. 5, the silicon cap layer 24, the Si—Ge layer 22, the seed layer 20, and the polysilicon layer 18 are patterned to the insulating layer 16 to form the Si—Ge base 6 for the bipolar transistor over the device areas 2, and leaving portions of the patterned layers extending over the STI regions 12 and over the polysilicon layer 18 to provide electrical contact regions 8 for the base 6. Layers 24, 22, 20, and 18 are patterned using a photoresist mask and anisotropic etching using an etchant gas that contains a chlorine species.

While the invention has been particularly shown and described with reference to the preferred embodiment thereof, it will be understood by those skilled in the art that various changes in form and details may be made without departing from the spirit and scope of the invention.

What is claimed is:

1. A method for making a silicon-germanium layer on a substrate for a base of a bipolar transistor comprising the steps of:
   providing said substrate having a shallow trench isolation region surrounding a device area with a first type dopant;
   depositing an insulating layer and a polysilicon layer on said substrate, and patterning to form an opening over said device area;
   forming a blanket seed layer on said substrate and said polysilicon layer at a first temperature;
   forming said silicon-germanium layer in-situ doped with a second type dopant, and forming a silicon cap layer on said blanket seed layer at a second temperature;
   patterning said silicon cap layer, said silicon-germanium layer, said seed layer, and said polysilicon layer to said insulating layer to form a silicon-germanium base over said device area.

2. The method of claim 1, wherein said substrate is a single-crystal silicon wafer having a crystallographic orientation of <100>.

3. The method of claim 1, wherein said first type dopant is phosphorus.

4. The method of claim 1, wherein said insulating layer is silicon oxide deposited by chemical vapor deposition to a thickness of between about 300 and 800 Angstroms.

5. The method of claim 1, wherein said polysilicon layer is deposited by chemical vapor deposition to a thickness of between about 300 and 800 Angstroms, and is doped with boron to a concentration of between about 1.0 E 18 and 1.0 E 20 atoms/cm$^3$.

6. The method of claim 1, wherein said blanket seed layer is silicon formed by epitaxial deposition on said device area to a thickness of between about 100 and 300 Angstroms.

7. The method of claim 1, wherein said first temperature is in a range of between about 600 and 750° C., and said seed layer is deposited for a time of between about 200 and 600 seconds.

8. The method of claim 1, wherein said silicon-germanium layer is formed to a thickness of between about 200 and 1000 Angstroms, and wherein said second temperature is in a range of about 50° C. lower than said first temperature.

9. The method of claim 1, wherein said silicon-germanium layer doped with said second type dopant is in-situ doped with boron to a concentration of between about 1.0 E 18 and 1.0 E 20 atoms/cm$^3$.

10. The method of claim 1, wherein said silicon-germanium layer has a germanium content of between about 10 and 20 atomic percent.

11. The method of claim 1, wherein said silicon-germanium layer is formed by molecular-beam epitaxy.

12. A method for making a silicon-germanium layer on a substrate for a base of an NPN bipolar transistor comprising the steps of:
    providing said substrate having a subcollector doped with phosphorus;
    forming shallow trench isolation regions over said subcollector and surrounding device areas for said base;
    depositing an insulating layer and a polysilicon layer on said substrate;
    forming openings in said polysilicon layer and said insulating layer over each of said device areas and said openings partially extending over said shallow trench isolation regions;
    forming a blanket seed layer on said substrate to form an epitaxial layer over said device areas, said seed layer formed at a first temperature to reduce the grain size of said seed layer over said shallow trench isolation regions;
    forming said silicon-germanium layer in-situ doped with boron, and forming a silicon cap layer on said blanket seed layer at a second temperature to minimize profile of said boron;
    patterning said silicon cap layer, said silicon-germanium layer, said seed layer, and said polysilicon layer to said insulating layer to form a silicon-germanium base over said device areas extending over said shallow trench isolation regions to provide areas for base contacts.

13. The method of claim 12, wherein said substrate is a single-crystal silicon wafer having a crystallographic orientation of <100>.

14. The method of claim 12, wherein said subcollector is doped with phosphorus to a concentration of between about 1.0 E 16 and 1.0 E 17 atoms/cm$^3$.

15. The method of claim 12, wherein said insulating layer is silicon oxide deposited by chemical vapor deposition to a thickness of between about 300 and 800 Angstroms.

16. The method of claim 12, wherein said polysilicon layer is deposited by chemical vapor deposition to a thickness of between about 300 and 800 Angstroms, and is doped with boron to a concentration of between about 1.0 E 18 and 1.0 E 20 atoms/cm$^3$.

17. The method of claim 12, wherein said blanket seed layer is silicon formed by epitaxial deposition on said device areas to a thickness of between about 100 and 300 Angstroms.

18. The method of claim 12, wherein said first temperature is in a range of between about 600 and 750° C., and said seed layer is deposited for a time of between about 200 and 600 seconds.

19. The method of claim 12, wherein said silicon-germanium layer is formed to a thickness of between about 200 and 1000 Angstroms, and wherein said second temperature is in a range of about 50° C. lower than said first temperature.

20. The method of claim 12, wherein said silicon-germanium layer is in-situ doped with boron to a concentration of between about 1.0 E 18 and 1.0 E 20 atoms/cm$^3$.

21. The method of claim 12, wherein said silicon-germanium layer has a germanium content of between about 10 and 20 atomic percent.

22. The method of claim 12, wherein said silicon-germanium layer is formed by molecular-beam epitaxy.

23. The method of claim 12, wherein said silicon-germanium layer is formed by chemical-vapor deposition.

* * * * *